(12) United States Patent
Donofrio et al.

(10) Patent No.: US 8,017,963 B2
(45) Date of Patent: Sep. 13, 2011

(54) LIGHT EMITTING DIODE WITH A DIELECTRIC MIRROR HAVING A LATERAL CONFIGURATION

(75) Inventors: Matthew Donofrio, Raleigh, NC (US); John Edmond, Durham, NC (US); James Ibbetson, Santa Barbara, CA (US); Ting Li, Ventura, CA (US)

(73) Assignee: Cree, Inc., Durham, NC (US)

( * ) Notice: Subject to any disclaimer, the term of this patent is extended or adjusted under 35 U.S.C. 154(b) by 225 days.

(21) Appl. No.: 12/329,722

(22) Filed: Dec. 8, 2008

(65) Prior Publication Data

US 2010/0140637 A1    Jun. 10, 2010

(51) Int. Cl.
*H01L 33/00*    (2010.01)
(52) U.S. Cl. ......... 257/98; 257/95; 257/99; 257/E21.09
(58) Field of Classification Search ................ 257/95, 257/98, 99, E21.09
See application file for complete search history.

(56) References Cited

U.S. PATENT DOCUMENTS

| | | | |
|---|---|---|---|
| 4,946,547 A | 8/1990 | Palmour et al. | 156/643 |
| 5,200,022 A | 4/1993 | Kong et al. | 156/612 |
| RE34,861 E | 2/1995 | Davis et al. | 437/100 |
| 6,657,236 B1 | 12/2003 | Thibeault et al. | 257/98 |
| 7,213,940 B1 | 5/2007 | Van de Ven et al. | 362/231 |
| 7,573,074 B2 | 8/2009 | Shum et al. | 257/99 |
| 7,915,629 B2 | 6/2010 | Ibbetson et al. | 257/98 |
| 7,795,623 B2 | 9/2010 | Emerson et al. | 257/79 |
| 7,821,023 B2 | 10/2010 | Yuan et al. | 257/98 |
| 2005/0242358 A1* | 11/2005 | Tu et al. | 257/98 |
| 2006/0060874 A1* | 3/2006 | Edmond et al. | 257/98 |
| 2007/0158668 A1 | 7/2007 | Tarsa et al. | 257/79 |
| 2008/0173884 A1 | 7/2008 | Chitnis et al. | 438/22 |
| 2008/0179611 A1 | 7/2008 | Chitnis et al. | 257/98 |
| 2008/0310158 A1 | 12/2008 | Harbers et al. | 362/294 |
| 2009/0050908 A1 | 2/2009 | Yuan et al. | 257/88 |
| 2009/0121241 A1 | 5/2009 | Keller et al. | 257/94 |
| 2009/0152583 A1* | 6/2009 | Chen et al. | 257/98 |
| 2009/0283779 A1 | 11/2009 | Negley et al. | 257/88 |
| 2010/0140636 A1 | 6/2010 | Donofrio et al. | 257/98 |
| 2011/0049546 A1 | 3/2011 | Heikman et al. | 257/98 |

FOREIGN PATENT DOCUMENTS

WO    WO 2005/117152 A1    12/2005

OTHER PUBLICATIONS

International Search Report and Written Opinion for counterpart Application No. PCT/US2009/066938 mailed Aug. 30, 2010.
High-Performance GaN-Based Vertical-Injection Light-Emitting Diodes with TiO2-SiO2 Omnidirectional Reflector and n-GaN Roughness, H.W. Huang, IEEE Photonics Technology Letters vol. 19 No. 8, Apr. 15, 2007.

(Continued)

*Primary Examiner* — Tan N Tran
(74) *Attorney, Agent, or Firm* — Koppel, Patrick, Heybl & Philpott (57) ABSTRACT

A light emitting diode is disclosed that includes an active structure, a first ohmic contact on the active structure, and a transparent conductive oxide layer on the active structure opposite the first ohmic contact. The transparent conductive oxide layer has a larger footprint than said active structure. A dielectric mirror is positioned on the transparent conductive oxide layer opposite said active structure and a second contact is positioned on the transparent conductive oxide layer opposite the dielectric mirror and separated from the active structure.

33 Claims, 5 Drawing Sheets

OTHER PUBLICATIONS

C.H. Lin at al., "Enhancement of InGaN-GaN Indium-Tin-Oxide Flip-Chip Light-Emitting Diodes with TiO2-SiO2 Multilayer Stack Omnidirectional Reflector," IEEE Photonics Technology Letters, vol. 18, No. 19, Oct. 1, 2006, pp. 2050-2052.

Windisch et al. "Impact of Texture-Enhanced Transmission on High-Efficiency Surface-Textured Light-Emitting Diodes," Applied Physics Letters, vol. 79, No. 15, Oct. 2001, pp. 2315-2317.

Schnitzer et al. "30% External Quantum Efficiency From Surface Textured, Thin-Film Light-Emitting Diodes," Applied Physics Letters, Oct. 18, 1993, vol. 64, No. 16, pp. 2174-2176.

Windisch at al. "Light-Extraction Mechanisms in High-Efficiency Surface-Textured Light-Emitting Diodes," IEEE Journal on Selected Topics in Quantum Electronics, vol. 8, No. 2, Mar./Apr. 2002, pp. 248-255.

Streubel, at al. "High Brightness AlGaInP Light-Emitting Diodes," IEEE Journal on Selected Topics in Quantum Electronics, vol. 8, No. 2, Mar./Apr. 2002, pp. 321-332.

CREE EZ400 LED Data Sheet, 2007 Cree's EZBright LEDs.
CREE EZ700 LED Data Sheet, 2007 Cree's EZBright LEDs.
CREE EZ1000 LED Data Sheet, 2007 Cree's EZBright LEDs.
CREE EZBright290 LED Data Sheet, 2007 Cree's EZBright LEDs.

* cited by examiner

LIGHT EMITTING DIODE WITH A DIELECTRIC MIRROR HAVING A LATERAL CONFIGURATION

BACKGROUND

The present invention relates to light emitting diodes. Light emitting diodes (LEDs) are a class of photonic semiconductor devices that convert an applied voltage into light by encouraging electron-hole recombination events in an appropriate semiconductor material. In turn, some or all of the energy released in the recombination event produces a photon. When recombination events produce photons, they initiate photons in all directions.

Light emitting diodes share a number of the favorable characteristics of other semiconductor solid-state devices. These include generally robust physical characteristics, long lifetime, high reliability, and, depending upon the particular materials, low cost. These physical characteristics, along with relatively low power requirements, make LEDs desirable as light output devices. The general theory and operation of LEDs are well understood in the art. Appropriate references about the structure and operation of light emitting diodes include S. M. SZE, PHYSICS OF SEMICONDUCTOR DEVICES (2d ed. 1981) and E. FRED SCHUBERT, LIGHT-EMITTING DIODES (2003).

Gallium Nitride (GaN)-based LEDs typically comprise an insulating or semiconducting substrate such as silicon carbide (SiC) or sapphire on which a plurality of GaN-based epitaxial layers are deposited. These epitaxial layers form an active region having a p-n junction, which emits light when energized. LEDs can be mounted substrate side down onto a submount or onto a lead frame, or both. Alternatively, flip-chip LEDs are mounted on the lead frame with the substrate side facing up; i.e., with the substrate side facing away from the submount.

Flip-chip mounted LEDs often incorporate vertical geometry. The term "vertical" does not necessarily describe the final position of the overall device, but instead describes an orientation within the device in which the electrical contacts used to direct current through the device and its p-n junction are positioned on opposite faces (axially) from one another in the device. Thus, in a typical form, a vertical device includes a conductive substrate, a metal contact on one face of the substrate, two or more epitaxial layers on the opposite face of the substrate to form the p-n light-emitting junction, and a top contact on the top epitaxial layer to provide a current path through the layers and their junction and through the substrate to the substrate contact.

Many LEDs employ reflective layers to improve their external light output. Such Reflective layers are typically positioned to redirect photons toward the desired emitting surface and away from any photon absorbing material. Reflective layers are typically made of metals such as Ag or Al. Metallic reflective layers have the advantage of reflecting light at arbitrary angles and polarizations, but have a higher optical loss than other reflectors. Dielectric mirrors, such as distributed Bragg reflectors (DBRs), have also been used as reflectors. DBRs have low optical loss and high reflectance, but have the disadvantage of effectively reflecting only that light which impinges near the direction normal to the DBR. A superior dielectric mirror has been demonstrated by using an omnidirectional reflector (ODR) composed of alternating layers of $TiO_2$ and $SiO_2$. C. H. Lim et al., *Enhancement of INGaN-GaN Indium-Tin-Oxide Flip-Chip Light-Emitting Diodes With $TiO_2$—$SiO_2$ Multilayer Stack Omnidirectional Reflector*, 18 IEEE PHOTONICS TECHNOLOGY LETTERS 2050 (2006); see also H. W. Huang et al., *High Performance GaN-Based Vertical-Injection Light-Emitting Diodes With $TiO_2$—$SiO_2$ Omnidirectional Reflector and n-GaN Roughness*, 19 IEEE PHOTONICS TECHNOLOGY LETTERS 565 (2007). An ODR has superior reflectance when compared to a DBR, because the ODR reflects light at any incidence angle and polarization.

When a metallic reflective layer is incorporated into a vertical flip chip LED, the metallic reflective layer can also include additional metal layers to serve to connect the p-layer to the conductive substrate. Making such an electrical connection typically requires high temperature processing. When a dielectric reflective layer, such as a DBR, is incorporated into a vertical flip chip LED, some other means must be made to connect the p-layer to the conductive substrate because dielectric reflective layers are electrically insulating. Present devices form this connection by creating via holes in the dielectric layers and filling the holes with one or more metals, which serve as conducting contacts. Although such vias provide the desired current path, they tend to absorb light and reduce the reflective advantages of the surrounding dielectric reflective layer. Thus, such vias can limit the benefits of using dielectric reflectors and can reduce the overall external quantum efficiency of LEDs that incorporate such mirrors and vias.

Accordingly, a need exists for LEDs with dielectric reflective layers that avoid or minimize the use of such light absorbing structures.

SUMMARY

In one aspect, the invention is a light emitting diode that includes an active structure, a first ohmic contact on the active structure, and a transparent conductive oxide layer on the active structure opposite the first ohmic contact. The transparent conductive oxide layer has a larger footprint than the active structure. The light emitting diode further includes a dielectric mirror on the transparent conductive oxide layer opposite the active structure. A second contact is positioned on the transparent conductive oxide layer opposite the dielectric mirror and is separated from the active structure.

In another aspect, the invention is a light emitting diode that includes a first Group III nitride epitaxial layer having a first conductivity type. A second Group III nitride epitaxial layer has the opposite conductivity type from the first layer and forms a p-n junction with the first layer. The light emitting diode further includes a transparent conductive oxide layer, which is adjacent the second Group III nitride layer and opposite the first Group III nitride layer. The transparent conductive oxide layer helps spread current across the p-n junction. The light emitting diode also includes a dielectric mirror for increasing the external quantum efficiency of the diode, which is adjacent the transparent conductive oxide layer and opposite the Group III nitride layers. In addition, the light emitting diode includes an ohmic contact to the first layer and a contact to the transparent conductive oxide layer, which provide current flow between the transparent conductive oxide layer and the ohmic contact and through the Group III nitride layers to generate output.

In another aspect the invention is a method of forming a light emitting diode with increased light extraction. The method includes the steps of forming a transparent conductive oxide layer on a p-type epitaxial layer of a light emitting diode structure that also includes at least an n-type layer adjacent the p-type layer, adding a dielectric reflector to the transparent conductive oxide opposite from the p-type layer, etching the n-type and p-type layers into a mesa using an etch that will remove the n-type and p-type layer materials, but that does not etch the transparent conductive oxide material, adding an n-type ohmic contacts to the n-type layer, and adding an ohmic contact to the transparent conductive oxide layer for connecting to the p-type layer.

DETAILED DESCRIPTION

Expressed broadly, the invention is a light emitting diode with improved light output efficiency. The diode design simplifies the fabrication process and helps reduce cost. A number of aspects of the invention are illustrated in the drawings. For descriptive purposes, the LED structures are described in terms of Group III nitrides and silicon carbide, but other materials can be incorporated where appropriate. The use of Group III nitrides, silicon carbide, and other materials in light emitting diodes is generally well established in the art and will not be otherwise described in detail.

As is familiar to those in the art, the active region of an LED generates photons when recombination events take place within one or more layers of semiconductor materials. The simplest structure in which this occurs is the p-n junction. Such p-n junction can comprise the active regions (or active layers) of the LED structures described in this invention. It will nevertheless be understood that the active region can include more complex structures such as single quantum wells, multiple quantum wells, and superlattice structures. Thus, although most of the discussions and drawings herein are set forth in terms of simple p-n junctions, it will be understood that in addition to simple p-n junctions the invention can incorporate complex structures and variations therebetween.

As well-understood in this art, in such more complex structures, the active layer (or layers) is often positioned between the p and n-type epitaxial layers. In typical embodiments, the active layer is a multiple-quantum well. As an example, such wells usually include between 2 and 25 periods of alternating layers of gallium nitride (GaN) and indium gallium nitride (InGaN). In many of these, the GaN and InGaN layers in the well are grown without proactive doping. As a result, the layers (although referred to as "undoped") are intrinsically n-type.

Figure 1:
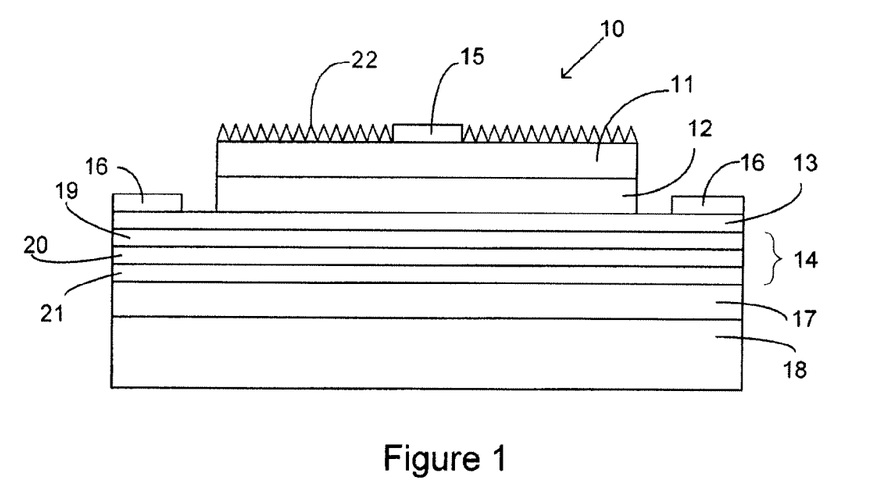
FIG. 1 is a cross-sectional schematic view illustrating a first embodiment of the invention.

FIG. 1 is a schematic cross-sectional diagram of one embodiment of and LED according to the present invention and broadly designated at 10. An n-layer and a p-layer are illustrated respectively at 11 and 12. Combined, the n-layer 11 and the p-layer 12 form the p-n junction (active region) of the LED 10, which generates photons upon the application of a forward current. The n-layer 11 and the p-layer 12 are formed from at least one and typically several, Group III nitride layers. The externally-facing layer (which in FIG. 1 is the n-layer 11) may have a light enhancing feature 22 such as a textured or lenticular surface for improving the light output efficiency of the LED 10.

A transparent conductive oxide (TCO) layer 13 creates an electric connection between a p-contact 16 and the p-layer 12.

In particular, the TCO layer 13 extends across all (or substantially all) of the area underneath the n-layer 11 and the p-layer 12. The TCO layer 13 serves to spread current more efficiently to these layers and thus more efficiently across the p-n junction (or its equivalent), with a resulting significant increase in external efficiency. In typical embodiments, the transparent conductive oxide layer 13 is formed of indium-tin-oxide. Alternatively, the transparent conductive oxide layer 13 may be formed from another suitable transparent conductive oxide such as fluorine doped tin oxide, aluminum doped zinc oxide, and zinc-tin-oxide.

The p-contact 16 is positioned on the transparent conductive oxide layer 13 so that the p-contact 16 is physically separated from the active structure formed by the n-layer 11 and the p-layer 12. An ohmic contact 15 provides an electrical connection to the n-layer 11. The p-contact 16 and the ohmic contact 15 may be formed from metals such as platinum, nickel, gold, titanium, chromium, aluminum, and silver including alloys of these metals and layers of two or more of these metals. In operation, current flows between the p-contact 16, the transparent conductive oxide layer 13, the active layer 11 and 12 and the ohmic contact 15.

A dielectric mirror 14 is positioned on the TCO layer 13 opposite the active layers 11 and 12 for increasing the external quantum efficiency of the diode 10. The mirror 14 is employed to improve the light output of the LED 10 by redirecting photons away from photon-absorbing material, such as a carrier substrate 18. By definition, the dielectric mirror 14 is electrically insulating, meaning that no electrical current from the carrier substrate 18 can pass through the dielectric mirror 14 to reach the p-layer 12. In the present embodiment, the dielectric mirror 14 is formed from alternating layers of $SiO_2$ and $TiO_2$. Although three layers 19, 20, and 21 are depicted, the dielectric mirror 14 may be formed from any number of alternating layers of $SiO_2$ and $TiO_2$. Each layer of $SiO_2$ has a thickness of between about 70 and 80 nm. In typical embodiments, each layer of $TiO_2$ has a thickness of between about 50 and 60 nm (based upon the wavelength). Alternatively, the dielectric mirror 14 may be a distributed Bragg reflector or any other type of dielectric reflector that does not interfere with the structure or operation of the LED 10.

In an exemplary embodiment, a hybrid omnidirectional reflector containing both dielectric materials and a metal layer is used. The hybrid design uses fewer dielectric layers than a full Bragg reflector, and is more compatible with an omnidirectional light source. Because this hybrid structure includes dielectric layers, it remains insulating with respect to the vertical axis of the device. Therefore, as used herein, the term dielectric mirror includes such hybrid structures.

In one example, the hybrid ODR is formed of a first layer of silicon dioxide ($SiO_2$) about 590 nm thick; a first layer of titanium dioxide ($TiO_2$) about 55 nm thick; a second layer of SiO2 about 100 nm thick; a second layer of $TiO_2$ about 75 nm thick; and a 200 nm layer of a reflective metals such as silver (Ag) or aluminum (Al). In a second example, the hybrid ODR may be a single layer of $SiO_2$ of about 0.5 um's with a reflective metal layer such as Ag or Aluminum. This is particularly effective for applications to a material with a higher index than the $SiO_2$ such as GaN. As these dimensions indicate, such hybrid designs can include different thickness layers in different periods (i.e., repeating structures) of the reflector. Conventional distributed Bragg reflectors (DBRs) typically have periods in which all of the layers have the same thickness. The dielectric layers refract specific wavelengths and the metal layer reflects most (and in many cases all) visible wavelengths.

The nature and operation of a distributed Bragg reflector (also called a Bragg mirror) are generally well understood in this art. The reflector is an alternating sequence of layers of two different optical materials for which a frequently used design is a quarter-wave mirror in which each optical layer thickness corresponds to one quarter of the wavelength the mirror is designed to reflect. In the illustrated embodiments, alternating layers of silicon dioxide and titanium dioxide are used to form the mirror.

The LED 10 includes a carrier substrate 18 which in the illustrated embodiment is attached to the mirror 14 with a bonding material 17. Because the LED's contacts 15 and 16 are arranged in a lateral orientation, the carrier substrate 18 can be formed from electrically conductive or electrically insulating materials. For example, the carrier substrate may be formed from SiC, sapphire, silicon, or metal. Furthermore, the lateral configuration of the contacts 15 and 16 avoids the need for vias to be constructed through the dielectric mirror 14 to electrically connect the carrier substrate 18 to the active region of the LED 10 formed by the n-layer 11 and the p-layer 12. The absence of vias reduces the amount of photon absorbing materials in the LED 10, enables the dielectric mirror 14 to reflect more light than with vias present, and enhances the external quantum efficiency of the device. The bonding material 17 may be any material suitable for bonding the LED 10 to the carrier substrate 18. Exemplary materials include glue and metals. As another benefit of the lateral configuration of the LED, a conductive metal bond is no longer required between the carrier substrate 18 and the LED 10, which eliminates the need for high temperature processing.

Figure 2:
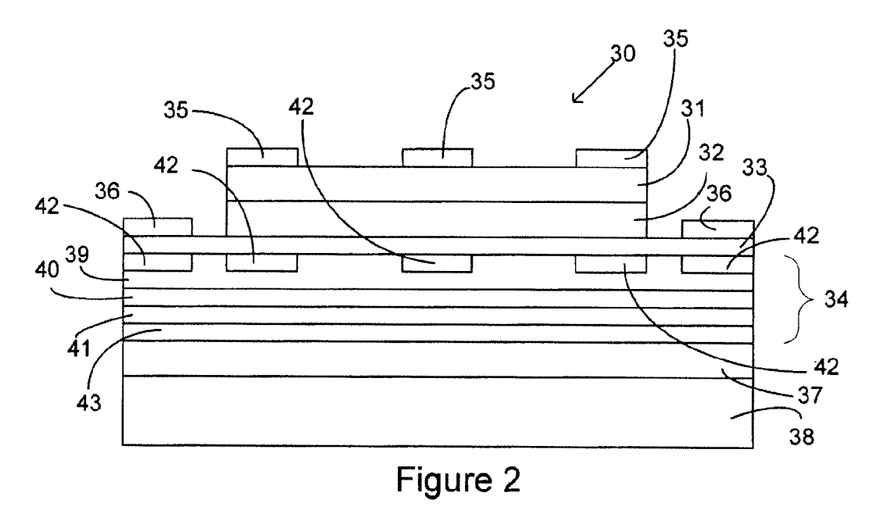
FIG. 2 is a cross-sectional schematic view illustrating a second embodiment of the invention.
Figure 3:
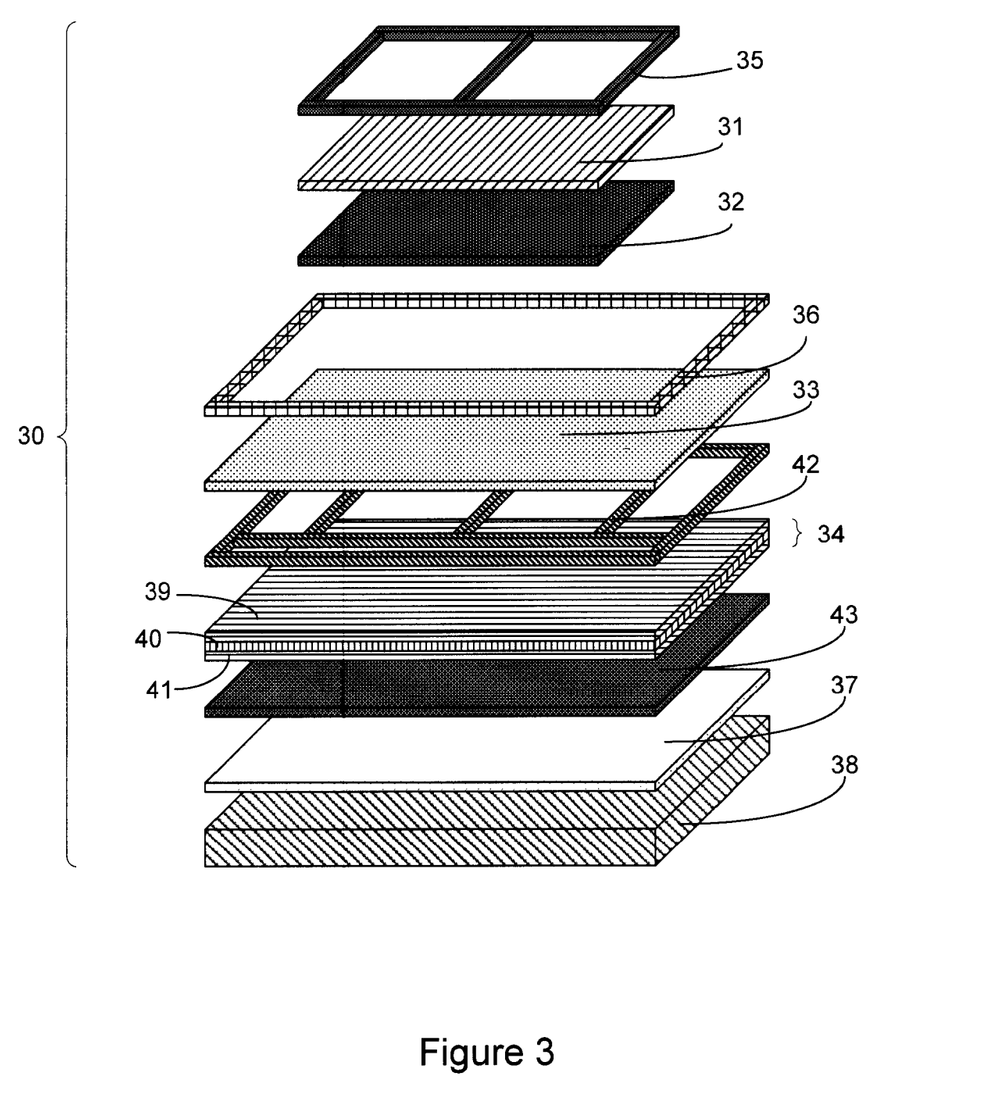
FIG. 3 is an exploded perspective view of the embodiment of the invention illustrated in FIG. 2.
Figure 4:
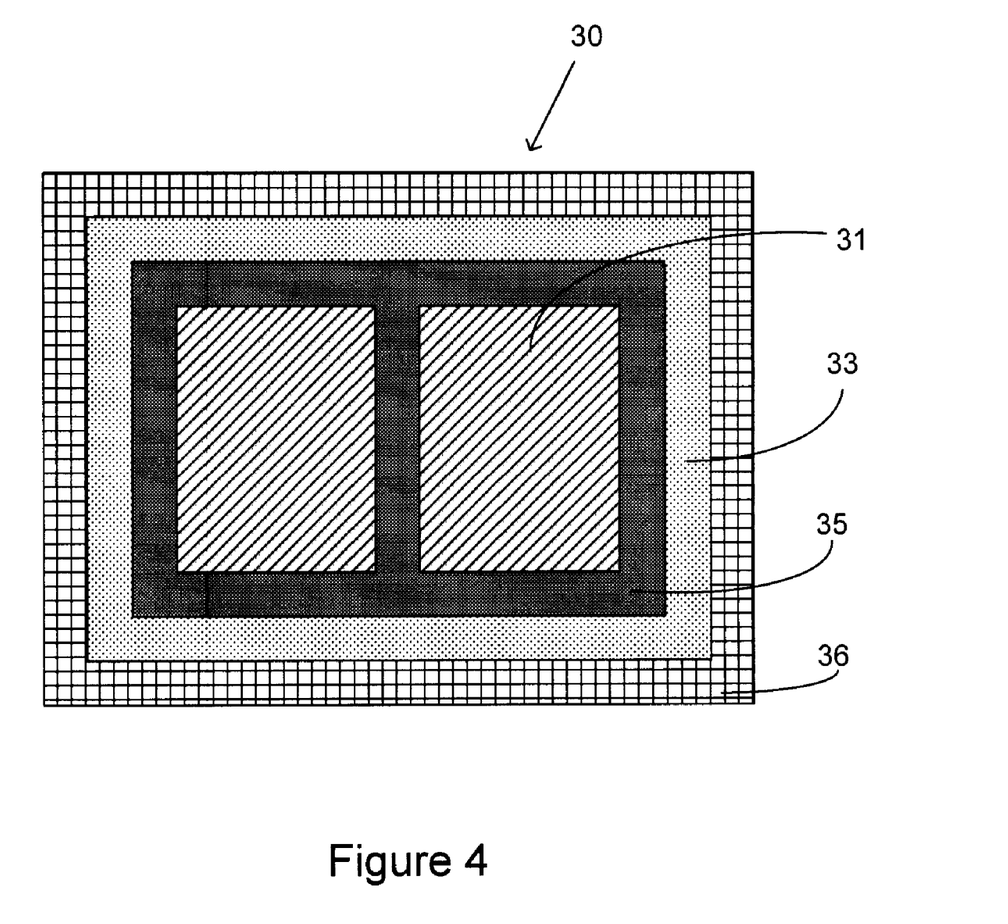
FIG. 4 is a top plan view of the embodiment of the invention illustrated in FIGS. 2 and 3.

FIGS. 2, 3 and 4 illustrate a second embodiment of the present invention. FIG. 2 is a schematic cross-sectional diagram of the second embodiment of the LED according to the present invention and is broadly designated at 30. FIG. 3 is an exploded view of the LED 30 and FIG. 4 depicts a top plan view of the LED 30. Wherever appropriate, the same reference numerals are used to designate the same elements in FIGS. 2, 3 and 4.

It will be understood that the exploded view of FIG. 3 is schematic in nature, and that the exact patterns of the illustrated elements may differ from the basic rectangular shapes illustrated in the drawings.

The LED 30 has an active region formed by an n-layer 31 and a p-layer 32. An ohmic contact 35 provides an electrical connection to the n-layer 31. As depicted in FIGS. 3 and 4, the ohmic contact 35 may be shaped like a grid, which provides improved current spreading across and through the n-layer 31. The grid shape of the contact 35 is preferable to simply enlarging an n-ohmic contact pad because the metals used to form the contacts reflect photons towards the carrier substrate and absorb other photons; both of which factors decrease the external quantum efficiency. The grid design of the invention improves external quantum efficiency by avoiding such losses while still providing improved current spreading.

A transparent conductive oxide layer 33 creates an electric connection between a p-contact 36 and the p-layer 32 and enhances current spreading as described earlier.

In the embodiment illustrated in FIGS. 2, 3 and 4, the diode 30 also includes an additional current spreading grid shown at 42. As illustrated, the grid 42 is positioned under the active (epitaxial) layers and above the Bragg reflector 34. In the illustrated embodiment, the grid 42 is on the bottom side of the transparent conductive oxide layer 33; i.e., opposite from the position of the p-layer 32 and the n-layer 31. Alternatively, the grid 42 can be on the p-layer 32 or on the TCO layer 33; i.e., on the opposite side of the TCO layer from the Bragg mirror 34. In typical embodiments, the grid 42 is reflective and formed of any appropriate metal that conducts well and that is otherwise compatible with the structure and function of the other elements of the device. In order to reduce the extent to which the grid 42 interferes with the external quantum efficiency of the diode 30, most (and in some cases all) portions of the grid 42 are geometrically congruent with either the p-contact 36, or with the n-ohmic contact 35, or with both.

A dielectric mirror 34 is formed from a plurality of alternating layers (e.g., 39, 40, and 42) of $TiO_2$ and $SiO_2$ and serves the same purpose as described earlier.

An optional reflective metal terminating layer 43 is adjacent to the dielectric mirror 34 and opposite the transparent conductive oxide layer 33. The reflective metal terminating layer 33 also redirects photons away from photon absorbing material, such as the carrier substrate 38.

The reflective metal terminating layer is advantageous when the diode is intended to be used to emit white light because the metal will reflect a wider range of wavelengths than would the distributed Bragg reflector 34 standing alone. Stated differently, the distributed Bragg reflector 34 reflects specific wavelengths or narrow ranges of wavelengths better than a metal mirror and is included for that purpose. For wider ranges of wavelengths, however, the specificity of the Bragg mirror is less helpful and thus the reflective metal terminating layer 43 provides the capability to reflect many, and in most cases all, wavelengths of visible light. Thus, when (for example) the LED is part of a white-emitting lamp, the reflective metal layer 43 increases the external quantum efficiency for frequencies other than those reflected by the Bragg mirror 34. The reflective metal layer 38 may be one or more metallic layers formed from Ag, Al, or any another appropriate metal.

In the illustrated embodiment, the LED 30 is attached to the carrier substrate 38 with a bonding material 37. In other embodiments, and as generally well understood in this art, the substrate could be a growth substrate upon which the illustrated layers of the diode 30 are added in appropriate fabrication steps. A growth substrate is less relevant in the context of the present invention, however, because the epitaxial layers 31 and 32 are not in direct contact with the substrate 38, but instead are separated by (at least) the Bragg mirror 34 and the reflecting metal layer 43. Thus, the capability for the substrate to support growth of the epitaxial layers is less relevant in the context of this diode design that it is in other diode designs in which the crystal structure of the substrate must be compatible with that of the epitaxial layers.

As a result, because the final structure of the diode need not include a growth substrate, the substrate 38 can be selected for other advantageous reasons such as cost, ease of fabrication, thermal advantages, or any other appropriate basis. A thermally conductive substrate is advantageous in many circumstances because it helps reduce the operating temperature of the diode, which in turn usually helps increase its effective lifetime.

FIGS. 5 through 11 illustrate method aspects of the invention. It will be understood that FIGS. 5-11 are schematic and exemplary rather than limiting of the method steps.

Where appropriate, the reference numerals in FIGS. 5-11 will correspond to the reference numerals in FIG. 3.

Figure 5:
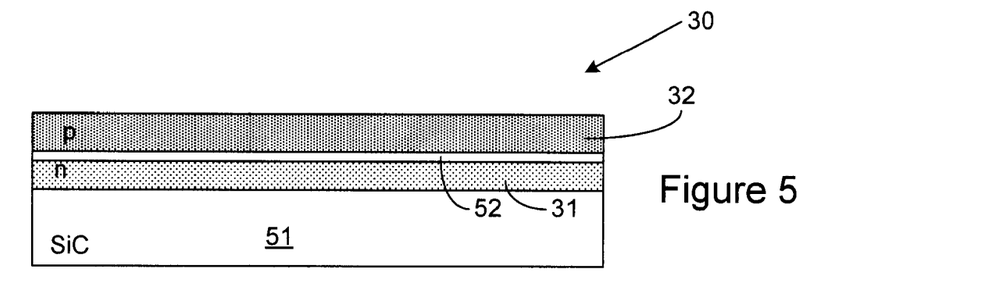
FIGS. 5-11 are cross-sectional schematic views of the method steps of the invention.

Therefore, FIG. 5 illustrates a diode precursor which for purposes of convenience will carry the reference numeral 30 throughout FIGS. 5-11 even though additional features are illustrated in each of these drawings. A silicon carbide substrate 51 provides the growth surface for the n-type epitaxial layer 31, an active layer 52, and the p-type epitaxial layer 32.

It will be understood that the diode 30 can include a structure as simple as a p-n junction without incorporating any further active layers. One or more active layers such as the layer illustrated at 52 are typical, however, in exemplary diodes. As well understood by persons of skill in this art, the active layer 52 typically comprises a multiple quantum well having between two and 25 periods of alternating layers of gallium nitride and indium gallium nitride. During the growth steps, no proactive doping is carried out on these periodic layers and thus although these layers are characterized as undoped, they are typically intrinsically n-type. It will be understood that the invention described herein can include structures as simple as a basic p-n junction, as complex as 25 (or more) periods of multiple quantum wells, or other structures of varying complexity.

The growth of gallium nitride, indium gallium nitride and other related Group III nitride materials on silicon carbide growth substrates is well understood in the art and will not be described in further detail herein.

Figure 6:
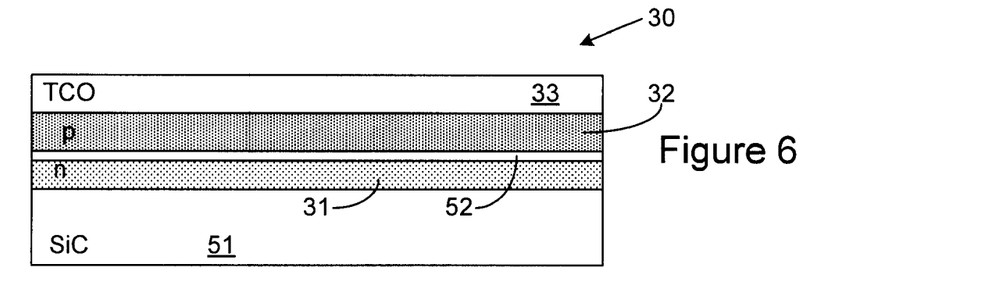

FIG. 6 illustrates the next step in the process in which the transparent conductive oxide (TCO) layer 33 is added to the p-type layer 32. As set forth earlier, the transparent conductive oxide layer 33 is typically formed of indium tin oxide (ITO) or a related transparent oxide.

Figure 7:
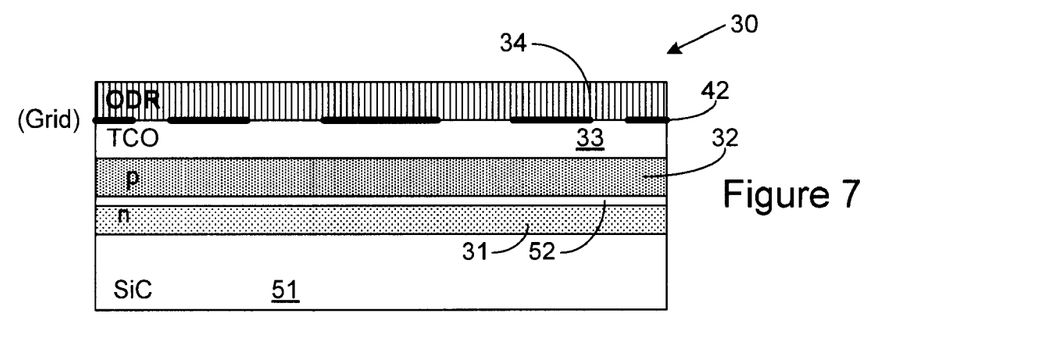

FIG. 7 illustrates two further steps in the process, namely the addition of the current spreading grid illustrated as the heavy lines 42 followed by the dielectric reflector (also referred to as an omnidirectional reflector or "ODR") 34. The grid 42 and the dielectric reflector 34 can take the same form as described previously and illustrated in FIG. 3.

Figure 8:
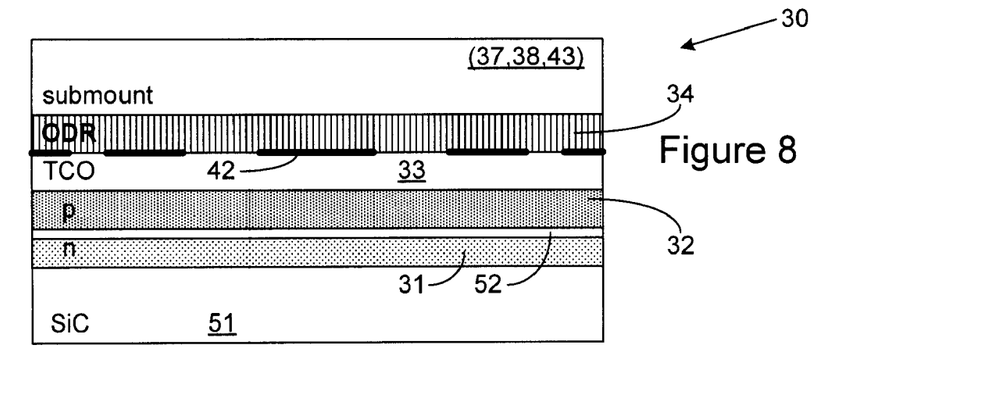

FIG. 8 illustrates a next step in the process in which a submount structure is added to the reflector 34. The submount can include one or more layers of appropriate materials as described and illustrated with respect to FIG. 3 and accordingly carries the reference numerals 37, 38 and 43 to indicate this. The submount can be conventionally bonded to the reflector 34 using another metal, an adhesive or (depending upon the materials), heat and pressure.

Figure 9:
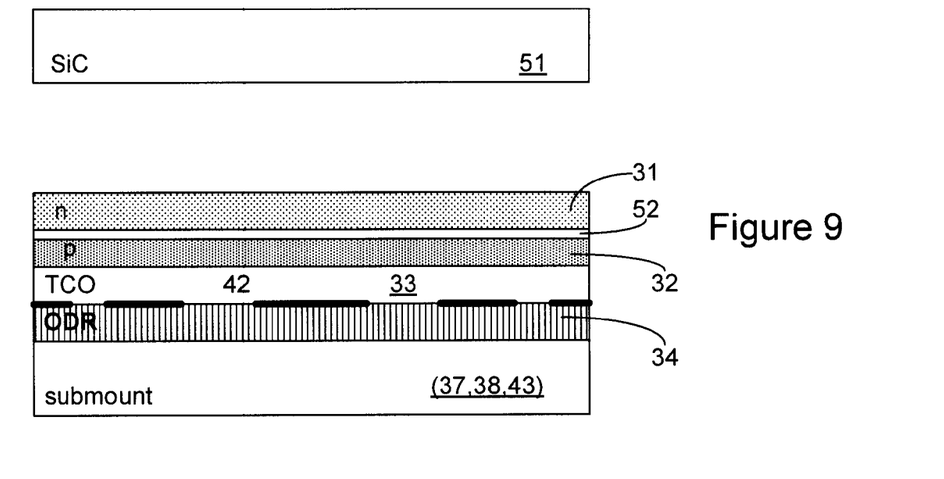

FIG. 9 illustrates the next step in the process in which the growth substrate 51 is removed and the diode 30 is flipped so that the submount 37, 38, 43 serves as the structural substrate.

Figure 10:
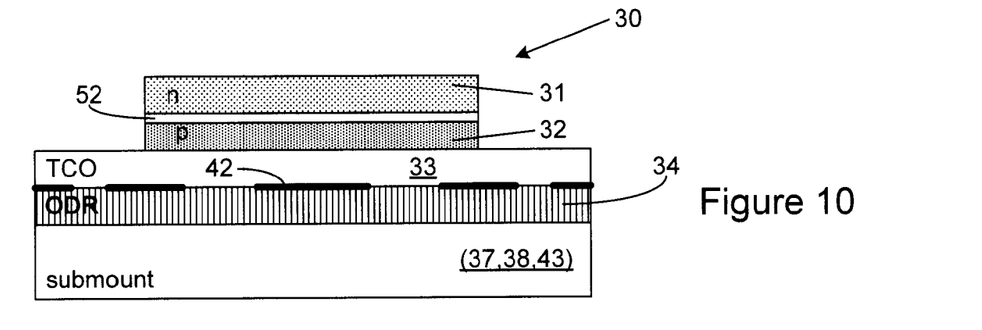

FIG. 10 illustrates that in the next step the diode 30 is etched to form a mesa that includes the n-type layer 31, the active layer 52, and the p-type layer 32. In the method of the invention, the transparent conductive oxide layer 33 and the etching technique are selected to be complementary to one another so that the transparent conductive oxide layer 33 serves as an etch stop. Thus, the etch will remove the materials in the n-type and p-type layers, but will be highly selective to the TCO material. This is particular appropriate because indium tin oxide and other appropriate transparent conductive oxide layers are suitable etch stops for both wet chemistry etching (e.g., potassium hydroxide) and dry etching (e.g., a halogen-based etch, typically chlorine-based) used to etch gallium nitride and related Group III nitrides.

Figure 11:
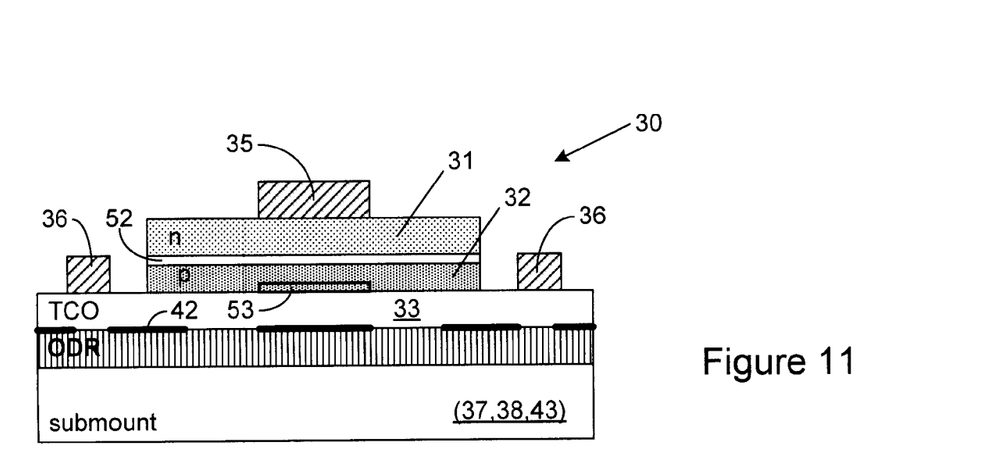

FIG. 11 illustrates the structure of the diode 30 after the last two steps are carried out, namely the addition of the n-ohmic contact 35 and the p-ohmic contact 36. These contacts are typically added in separate steps, although this is a result of conventional techniques rather than any limitation on the method per se. If appropriate metals can be deposited in a single step, both of the n and p-ohmic contacts 35 and 36 can be added in a single step or in closely combined steps.

By adding the ohmic contacts from the top side during the fabrication process, the method eliminates the need for a metal/conductive bond.

FIG. 11 also illustrates that in preferred embodiments, the diode 30 includes a reduced conductivity region 53 extending into the p-type layer 32. The fabrication and design of such a reduced conductivity region is described in detail in, for example, commonly assigned US Patent Application Publication No. 20080217635, the contents of which are incorporated entirely herein by reference.

Described briefly, the reduced conductivity region 53 is produced during fabrication. Preferably, the geometry of the region is generally (or specifically) congruent with both the n-ohmic contact 35 and the relevant portions of the current spreading grid 42. The presence of the reduced conductivity region 53 encourages more current to flow through the other portions of the p-type layer 32.

The ohmic contact 35 will, of course, typically block some of the light generated by the diode. Matching the geometry of the reduced conductivity region 53 to that of the contact 35 encourages more current to flow through the portions of the p-type layer 32 that are not optically blocked by the ohmic contact 35. As a result, the remaining portions of the p-type layer 32 emit more light with little or no net loss from the reduced conductivity region. This helps increase the external efficiency of the diode 30 (it being well-understood in the art that the p-type layer will typically have lower conductivity than the n-type layer.

The external surfaces of the diode 30 can also include light extraction and enhancement features as set forth in commonly assigned and co-pending application Ser. No. 12/329,713 filed concurrently herewith for "Light Emitting Diode With Improved Light Extraction." The contents of the Light Emitting Diode With Improved Light Extraction application are incorporated entirely herein by reference.

In the drawings and specification there have been set forth preferred embodiments of the invention, and although specific terms have been employed, they are used in a generic and descriptive sense only and not for purposes of limitation, the scope of the invention being defined in the claims.

The invention claimed is:

1. A light emitting diode comprising:
   an active structure;
   a first ohmic contact on said active structure;
   a transparent conductive oxide layer on said active structure opposite said first ohmic contact, said transparent conductive oxide layer having a larger footprint than said active structure;
   a dielectric mirror on said transparent conductive oxide layer opposite said active structure; and
   a second contact, said second contact being positioned on said transparent conductive oxide layer opposite said dielectric mirror and separated from said active structure.

2. A light emitting diode according to claim 1 further comprising a reflective metal layer on said dielectric mirror opposite said transparent conductive oxide layer.

3. A light emitting diode according to claim 1 further comprising a current spreading grid located between said transparent conductive oxide layer and said dielectric mirror.

4. A light emitting diode according to claim 3 wherein:
   said first ohmic contact comprises a grid; and
   said current spreading grid is congruent with portions of said first ohmic contact and with portions of said second contact.

5. A light emitting diode according to claim 3 wherein said current spreading grid comprises at least one metal from the group consisting of titanium, gold, zinc, indium, nickel, and beryllium.

6. A light emitting diode according to claim 1 wherein said active structure comprises a plurality of epitaxial layers formed from the Group III nitride material system.

7. A light emitting diode according to claim 1 wherein said transparent conductive oxide layer is formed from indium-tin-oxide.

8. A light emitting diode according to claim 1 wherein said dielectric mirror is formed from alternating layers of $TiO_2$ and $SiO_2$.

9. A light emitting diode according to claim 1 further comprising a lenticular surface on at least portions of said active structure.

10. A light emitting diode comprising:
a first Group III nitride epitaxial layer having a first conductivity type;
a second Group III nitride epitaxial layer adjacent said first Group III nitride epitaxial layer and having the opposite conductivity type from said first Group III nitride epitaxial layer for forming a p-n junction with said first Group III nitride epitaxial layer;
a transparent conductive oxide layer for providing current across the p-n junction formed by said Group III nitride epitaxial layers, said transparent conductive oxide layer being adjacent said second Group III nitride epitaxial layer and opposite from said first Group III nitride epitaxial layer;
a dielectric mirror for increasing the external quantum efficiency of said light emitting diode, said dielectric mirror being adjacent said transparent conductive oxide layer and opposite from said Group III nitride epitaxial layers;
an ohmic contact to said first Group III nitride epitaxial layer; and
a contact to said transparent conductive oxide layer for providing current flow between said transparent conductive oxide layer and said ohmic contact and through said Group III nitride epitaxial layers to generate output.

11. A light emitting diode according to claim 10 further comprising a reflective metal layer adjacent said dielectric mirror and opposite from said transparent conductive oxide layer.

12. A light emitting diode according to claim 11 wherein said dielectric mirror is formed from alternating layers of $TiO_2$ and $SiO_2$.

13. A light emitting diode according to claim 12 wherein the layers of $TiO_2$ have a thickness of between about 50 and 60 nm, and wherein the layers of $SiO_2$ have a thickness of between about 70 and 80 nm.

14. A light emitting diode according to claim 11 further comprising a carrier substrate bonded to said reflective metal layer with a bonding material.

15. A light emitting diode according to claim 14 wherein said bonding material comprises one or more metals.

16. A light emitting diode according to claim 14 wherein said bonding material comprises glue.

17. A light emitting diode according to claim 14 wherein said carrier substrate is selected from the group consisting of SiC, sapphire, silicon, and metals.

18. A light emitting diode according to claim 14 wherein said carrier substrate is electrically insulating.

19. A light emitting diode according to claim 10 further comprising a current spreading grid positioned between said Group III nitride epitaxial layers and said dielectric mirror.

20. A light emitting diode according to claim 19 wherein:
said ohmic contact to said first Group III nitride layer comprises a grid; and
said current spreading grid is congruent with portions of said ohmic contact to said first Group III nitride layer and with portions of said contact to said transparent conductive oxide layer.

21. A light emitting diode according to claim 19 wherein said current spreading grid is formed from one or more metals.

22. A light emitting diode according to claim 21 wherein said current spreading grid comprises at least one metal from the group consisting of titanium, gold, zinc, indium, nickel, and beryllium.

23. A light emitting diode according to claim 19 wherein said current spreading grid is positioned between said transparent conductive oxide layer and said dielectric mirror.

24. A light emitting diode according to claim 19 wherein said current spreading grid is positioned on said second Group III nitride epitaxial layer.

25. A light emitting diode according to claim 10 wherein said transparent conductive oxide layer is formed from indium-tin-oxide.

26. A light emitting diode according to claim 10 wherein said transparent conductive oxide layer is formed from fluorine doped tin oxide.

27. A light emitting diode according to claim 10 wherein said transparent conductive oxide layer is formed from aluminum doped zinc oxide.

28. A light emitting diode according to claim 10 wherein said transparent conductive oxide layer is formed from zinc-tin-oxide.

29. A light emitting diode according to claim 10 further comprising a carrier substrate bonded to said dielectric mirror opposite said transparent conductive oxide layer with a bonding material.

30. A light emitting diode according to claim 29 wherein said bonding material comprises one or more metals.

31. A light emitting diode according to claim 29 wherein said bonding material comprises glue.

32. A light emitting diode according to claim 29 wherein said carrier substrate is selected from the group consisting of SiC, sapphire, silicon, and metals.

33. A light emitting diode according to claim 29 wherein said carrier substrate is formed from an electrically insulating material.

* * * * *